United States Patent
Tsai et al.

(10) Patent No.: US 10,514,167 B1
(45) Date of Patent: Dec. 24, 2019

(54) METHOD AND APPARATUS FOR CONTROLLING EXHAUST PRESSURE FOR AN EXTREME ULTRAVIOLET GENERATION CHAMBER

(71) Applicant: TAIWAN SEMICONDUCTOR MANUFACTURING CO., LTD., Hsinchu (TW)

(72) Inventors: Ming-Hsun Tsai, Hsinchu (TW); Ping-Cheng Li, Hsinchu (TW); Yen-Hsun Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/389,579

(22) Filed: Apr. 19, 2019

Related U.S. Application Data

(60) Provisional application No. 62/692,205, filed on Jun. 29, 2018.

(51) Int. Cl.
    *F23G 7/06*     (2006.01)
    *F23G 5/12*     (2006.01)
    *F23G 5/50*     (2006.01)
    *H05G 2/00*     (2006.01)
    *G03F 7/20*     (2006.01)

(52) U.S. Cl.
    CPC ............... *F23G 7/065* (2013.01); *F23G 5/12* (2013.01); *F23G 5/50* (2013.01); *H05G 2/008* (2013.01); *F23G 2207/101* (2013.01); *F23G 2207/102* (2013.01); *F23G 2207/112* (2013.01); *F23G 2209/141* (2013.01); *G03F 7/70033* (2013.01); *G03F 7/70916* (2013.01)

(58) Field of Classification Search
    USPC ........................................................ 250/504 R
    See application file for complete search history.

(56) References Cited

U.S. PATENT DOCUMENTS

2019/0041058 A1* 2/2019 Miyazaki ............... F23G 7/065

\* cited by examiner

*Primary Examiner* — Kiet T Nguyen
(74) *Attorney, Agent, or Firm* — McDermott Will & Emery LLP

(57) ABSTRACT

An apparatus coupled to a chamber for processing extreme ultraviolet radiation includes a gas inlet configured to direct exhaust gases from the chamber into a combustion zone. The combustion zone is configured to flamelessly ignite the exhaust gases. An air inlet is configured to direct a mixture of air and a fuel into the combustion zone. A control valve is configured to change a volume of fluid exhausted from the combustion zone. A controller configured to control the control valve so as to prevent a pressure inside the combustion zone from exceeding a preset pressure value is provided.

20 Claims, 10 Drawing Sheets

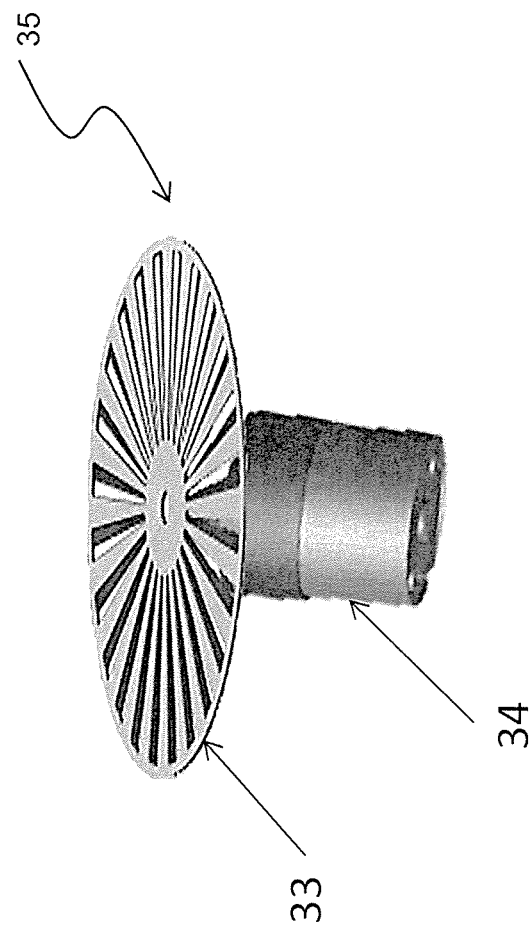
FIG. 5A
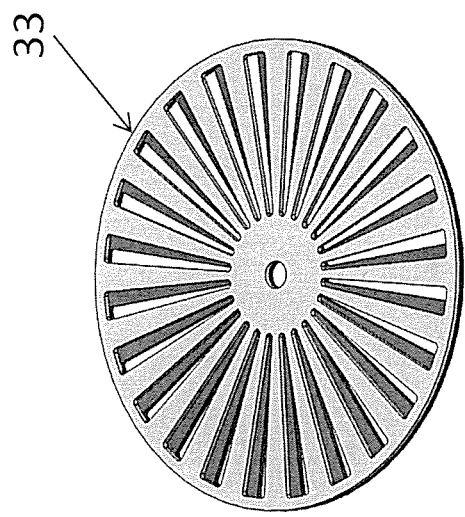
FIG. 5B
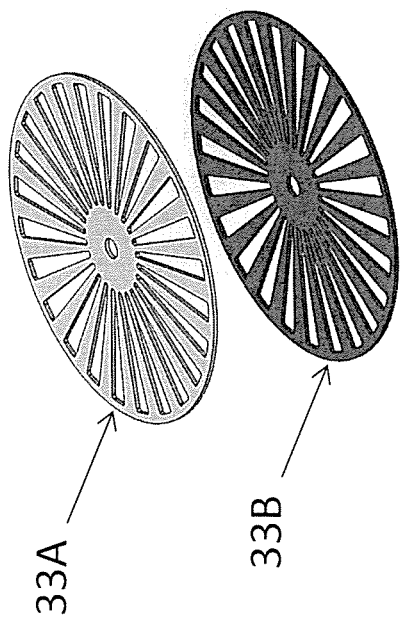

Butterfly Valve Type 520

Gate Valve Type 550

METHOD AND APPARATUS FOR CONTROLLING EXHAUST PRESSURE FOR AN EXTREME ULTRAVIOLET GENERATION CHAMBER

RELATED APPLICATIONS AND CROSS-REFERENCE

This application claims priority to U.S. Provisional Application No. 62/692,205 filed on Jun. 29, 2018, entitled "Method and Apparatus for Controlling Exhaust Pressure for an Extreme Ultraviolet Generation Chamber," the entire disclosures of which is incorporated herein by reference.

TECHNICAL FIELD

The present disclosure relates generally to an apparatus for producing extreme ultraviolet radiation, and more specifically to a method and apparatus for maintaining exhaust pressure for a chamber used in the generation of extreme ultraviolet radiation.

BACKGROUND

Extreme ultraviolet lithography is one of the most promising techniques for manufacturing integrated circuits (ICs) with ever smaller feature sizes. One method for generating extreme ultraviolet radiation is laser produced plasma, where tiny droplets of metals such as tin are heated to very high temperatures in a chamber using a high intensity laser beam such as that of a carbon dioxide laser. The heat ionizes tin atoms to form a tin plasma which radiates extreme ultraviolet when coming back to ground state. The process generates metal particles which can contaminate optics within the chamber as well as potentially outside the chamber where the extreme ultraviolet radiation is directed. One method for reducing the contamination from metal vapor is by introducing a gas such as hydrogen into the chamber to reduce the metal particles and convert them into gaseous matter that can be removed through the chamber exhaust.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 5A illustrate an embodiment of an exemplary flow adjuster, according to some embodiments.

FIGS. 5B, 5C, 5D, and 5E illustrate various embodiments of a control valve used for controlling the volume of fluid exhausted from the combustor in accordance with some embodiments of the disclosure.

DETAILED DESCRIPTION

Figure 1:
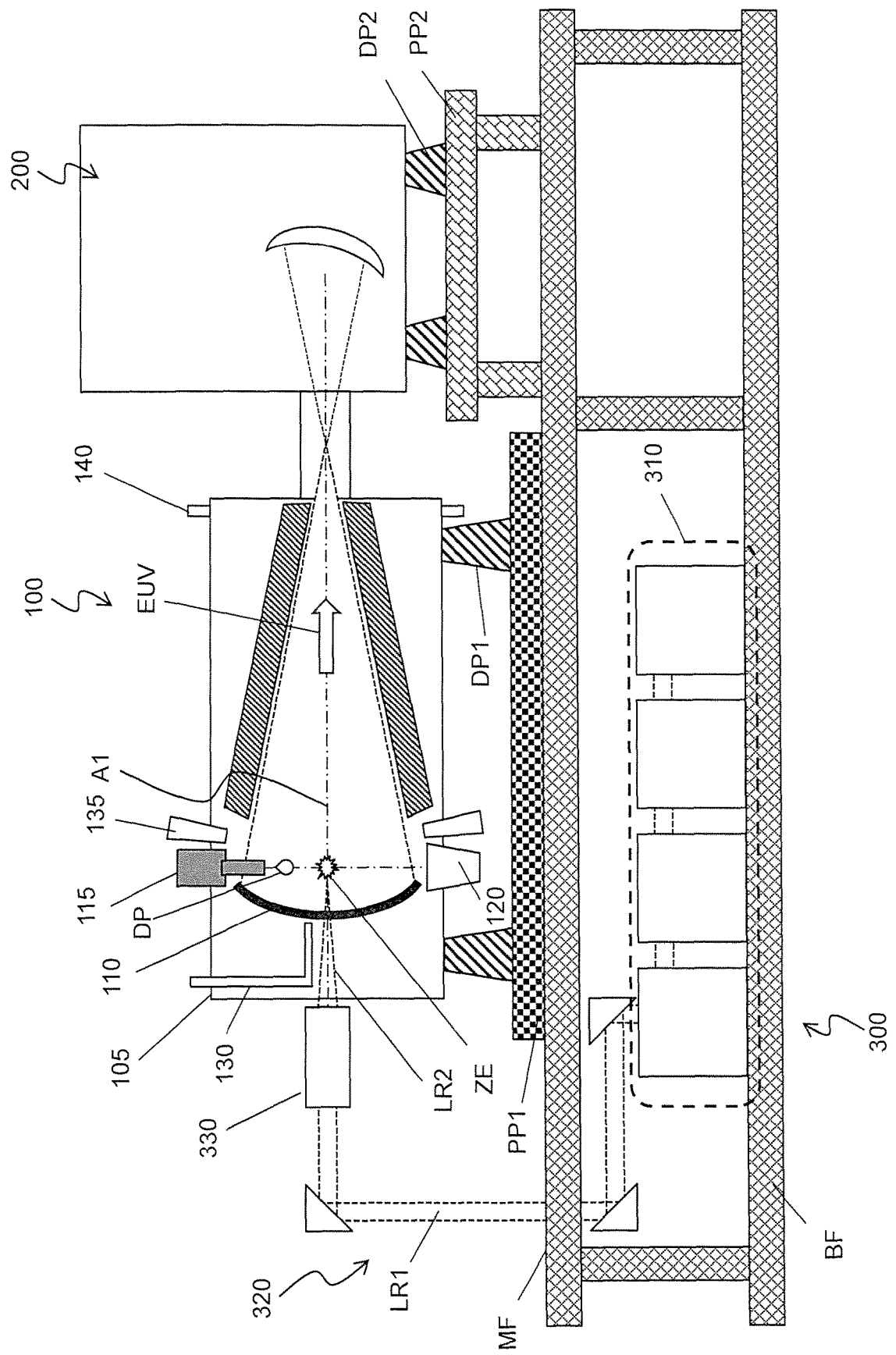
FIG. 1 is a schematic view of an extreme ultraviolet lithography system with a laser produced plasma (LPP) extreme ultraviolet radiation source, constructed in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus/device may be otherwise oriented (rotated 90 degrees or at other orientations) and the spatially relative descriptors used herein may likewise be interpreted accordingly. In addition, the term "made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

While methods disclosed herein are illustrated and described as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

The present disclosure relates to apparatuses and methods for generating extreme ultraviolet radiation. In particular, embodiments disclosed herein relate to controlling a flow of hydrogen through the chamber of an extreme ultraviolet radiation source such that safe operating conditions can be maintained without having to shut-down the extreme ultraviolet radiation source. The methods and apparatuses disclosed herein provide for a more stable hydrogen pressure in the chamber by controlling the rate of exhaust gases resulting from combustion of hydrogen pumped out of the chamber. By improving the control of flow rate of hydrogen, source shut-downs are prevented, thereby increasing the yield of the extreme ultraviolet lithography tool as well as saving the expense associated with restarting the extreme ultraviolet lithography tool.

FIG. 1 is a schematic and diagrammatic view of an extreme ultraviolet lithography system. The extreme ultraviolet lithography system includes an extreme ultraviolet radiation source apparatus 100 to generate extreme ultraviolet light, an exposure tool 200, such as a scanner, and an excitation laser source apparatus 300. As shown in FIG. 1, in some embodiments, the extreme ultraviolet radiation source apparatus 100 and the exposure tool 200 are installed on a main floor MF of a clean room, while the excitation source apparatus 300 is installed in a base floor BF located under the main floor. Each of the extreme ultraviolet radiation source apparatus 100 and the exposure tool 200 are placed over pedestal plates PP1 and PP2 via dampers DP1 and DP2, respectively. The extreme ultraviolet radiation source apparatus 100 and the exposure tool 200 are coupled to each other by a coupling mechanism, which may include a focusing unit.

The lithography system is an extreme ultraviolet lithography system designed to expose a resist layer by extreme ultraviolet light (or extreme ultraviolet radiation). The resist layer is a material sensitive to the extreme ultraviolet light. The extreme ultraviolet lithography system employs the extreme ultraviolet radiation source apparatus 100 to generate extreme ultraviolet light, such as extreme ultraviolet light having a wavelength ranging between about 1 nm and about 100 nm. In one particular example, the extreme ultraviolet radiation source 100 generates an extreme ultraviolet light with a wavelength centered at about 13.5 nm. In the present embodiment, the extreme ultraviolet radiation source 100 utilizes a mechanism of laser-produced plasma (LPP) to generate the extreme ultraviolet radiation.

The exposure tool 200 includes various reflective optic components, such as convex/concave/flat mirrors, a mask holding mechanism including a mask stage, and wafer holding mechanism. The extreme ultraviolet radiation extreme ultraviolet generated by the extreme ultraviolet radiation source 100 is guided by the reflective optical components onto a mask secured on the mask stage. In some embodiments, the mask stage includes an electrostatic chuck (e-chuck) to secure the mask. Because gas molecules absorb extreme ultraviolet light, the lithography system for the extreme ultraviolet lithography patterning is maintained in a vacuum or a-low pressure environment to avoid extreme ultraviolet intensity loss.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped $SiO_2$, or other suitable materials with low thermal expansion. The mask includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the extreme ultraviolet light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an extreme ultraviolet phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The extreme ultraviolet radiation (extreme ultraviolet light) directed from the mask, carrying the image of the pattern defined on the mask, is collected by the projection optics module, thereby forming an image onto the resist.

In the present embodiments, the semiconductor substrate is a semiconductor wafer, such as a silicon wafer or other type of wafer to be patterned. The semiconductor substrate is coated with a resist layer sensitive to the extreme ultraviolet light in the present embodiment. Various components including those described above are integrated together and are operable to perform lithography exposing processes.

The lithography system may further include other modules or be integrated with (or be coupled with) other modules.

As shown in FIG. 1, the extreme ultraviolet radiation source 100 includes a target droplet generator 115 and a LPP collector 110, enclosed by a chamber 105. The target droplet generator 115 generates a plurality of target droplets DP. In some embodiments, the target droplets DP are tin (Sn) droplets. In some embodiments, the tin droplets each have a diameter about 30 microns (μm). In some embodiments, the tin droplets DP are generated at a rate about 50 droplets per second and are introduced into a zone of excitation ZE at a speed of about 70 meters per second (m/s). Other material can also be used for the target droplets, for example, a tin containing liquid material such as eutectic alloy containing tin or lithium (Li).

The excitation laser LR2 generated by the excitation laser source apparatus 300 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of extreme ultraviolet light.

In various embodiments, the pre-heat laser pulses have a spot size about 100 μm or less, and the main laser pulses have a spot size about 200-300 μm.

The laser pulses LR2 are generated by the excitation laser source 300. The laser source 300 may include a laser generator 310, a laser guide optics 320 and a focusing apparatus 330. In some embodiments, the laser source 310 includes a carbon dioxide ($CO_2$) or a neodymium-doped yttrium aluminum garnet (Nd:YAG) laser source. The laser light LR1 generated by the laser generator 300 is guided by the laser guide optics 320 and focused into the excitation laser LR2 by the focusing apparatus 330, and then introduced into the extreme ultraviolet radiation source 100.

The laser light LR2 is directed through windows (or lenses) into the zone of excitation ZE. The windows adopt a suitable material substantially transparent to the laser beams. The generation of the pulse lasers are synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits extreme ultraviolet radiation extreme ultraviolet, which is collected by the collector mirror 110. The collector 110 further reflects and focuses the extreme ultraviolet radiation for the lithography exposing processes. In some embodiments, a droplet catcher 120 is installed opposite the target droplet generator 115. The droplet catcher 120 is used for catching excessive target droplets. For example, some target droplets may be purposely missed by the laser pulses.

The collector 110 is designed with a proper coating material and shape to function as a mirror for extreme ultraviolet collection, reflection, and focusing. In some embodiments, the collector 110 is designed to have an ellipsoidal geometry. In some embodiments, the coating material of the collector 110 is similar to the reflective multilayer of the extreme ultraviolet mask. In some examples, the coating material of the collector 110 includes ML (such as a plurality of Mo/Si film pairs) and may further include a capping layer (such as Ru) coated on the ML to substantially reflect the extreme ultraviolet light. In some embodiments, the collector 110 may further include a grating structure designed to effectively scatter the laser beam directed onto the collector 110. For example, a silicon nitride layer is coated on the collector 110 and is patterned to have a grating pattern.

In such an extreme ultraviolet radiation source apparatus, the plasma caused by the laser application creates physical debris, such as ions, gases and atoms of the droplet, as well as the desired extreme ultraviolet radiation. It is necessary to prevent the accumulation of material on the collector 110 and also to prevent physical debris exiting the chamber 105 and entering the exposure tool 200.

As shown in FIG. 1, in the present embodiments, a buffer gas is supplied from a first buffer gas supply 130 through the aperture in collector 110 by which the pulse laser is delivered to the tin droplets. In some embodiments, the buffer gas is $H_2$, He, Ar, N or another inert gas. In certain embodiments, $H_2$ is used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the extreme ultraviolet radiation. Hydrogen gas reaching to the coating surface of the collector 110 reacts chemically with a metal of the droplet forming a hydride, e.g., metal hydride. When tin (Sn) is used as the droplet, stannane ($SnH_4$), which is a gaseous byproduct of the extreme ultraviolet generation process, is formed. The gaseous $SnH_4$ is then pumped out through the outlet 140. However, the amount of hydrogen pumped into the chamber, in most cases, is far in excess of the amount that combines with tin. Thus, the gas being pumped out through outlet 140 primarily contains hydrogen which needs to be disposed safely. One of the methods to dispose hydrogen is to burn it so as to convert it into water which can then be disposed safely.

Figure 2:
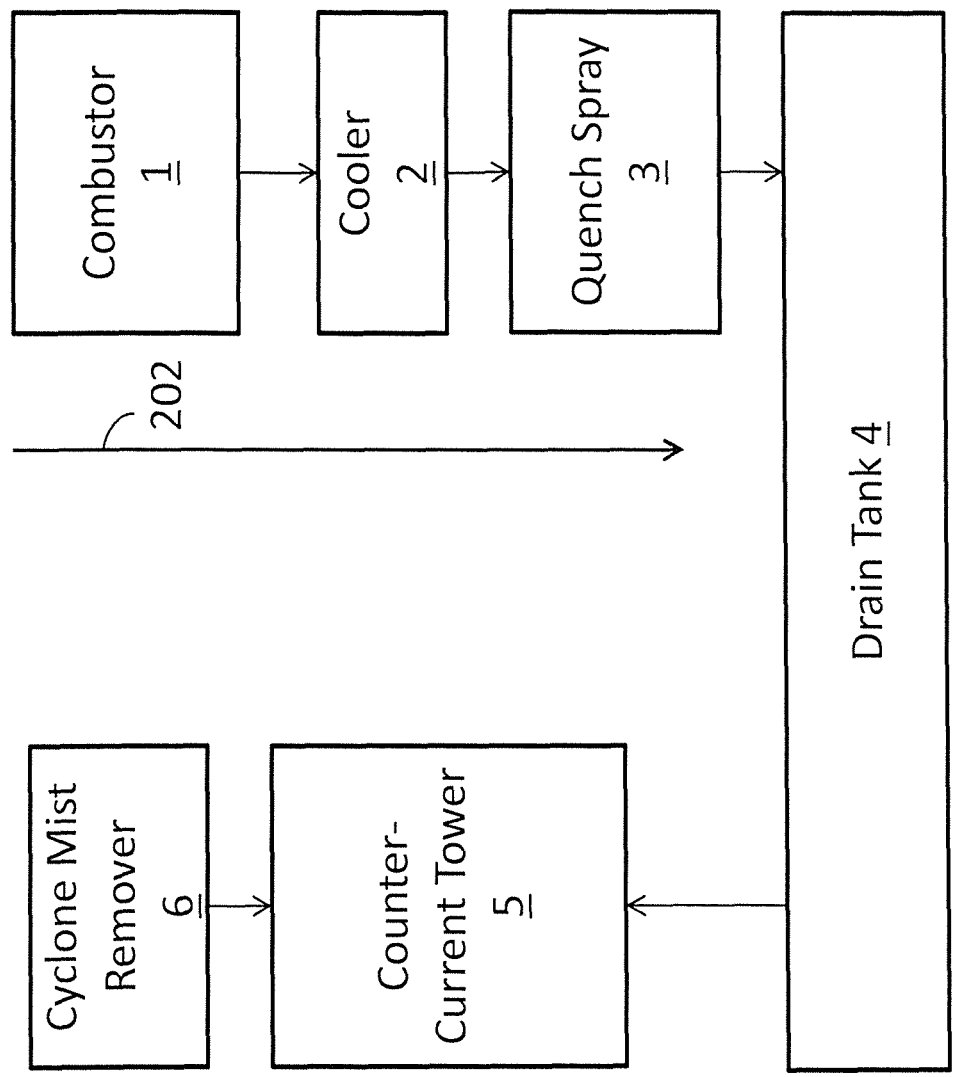
FIG. 2 shows a schematic diagram of an exemplary apparatus for processing exhaust gases from a chamber for processing extreme ultraviolet radiation.
Figure 3A:
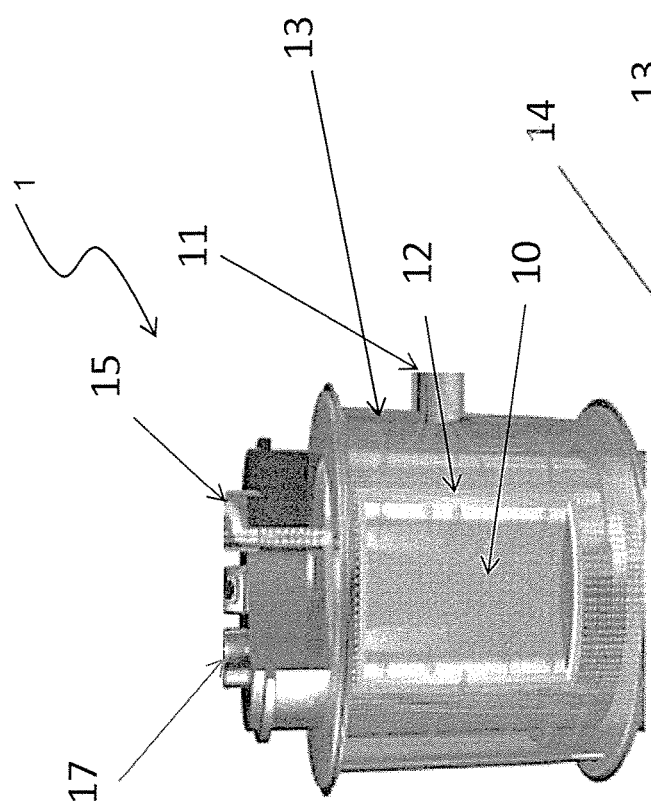
FIGS. 3A and 3B illustrate an exemplary combustor and its functioning in accordance with an embodiment.

FIG. 2 shows a schematic diagram of an apparatus for processing exhaust gases from a chamber for processing extreme ultraviolet radiation according to embodiments of the present disclosure. The apparatus shown in FIG. 2 includes combustor 1, e.g., a radiant burner, as shown in FIG. 3A, for flameless combusting of the exhaust gases which include hydrogen. In some embodiments, the exhaust gases include gaseous tin and/or stannane. In an embodiment, the exhaust gases from the chamber are directed vertically downwards into the combustor 1. The gases exhausted from the combustor 1, which include water vapor, are cooled in cooler 2 such as, for example, a Weir cooler, with overflow water to ensure that no solid particulate residue is left in the cooler following the cooling of the gases exhausted from the combustor 1. In some embodiments, FIG. 2 shows relative locations of the components, combustor 1, cooler 2, quench spray 3, drain tank 4, counter-current tower 5, and cyclone mist remover 6 of the apparatus along the vertical (gravity) direction 202. In some embodiments, the components of the apparatus are arranged in different structures.

The apparatus further includes a quench spray 3 for efficient removal of any solid powder formed after cooling of the gases exhausted from the combustor 1 in the cooler 2. In an embodiment, the quench spray 3 includes a water spray with a high flow rate such as, for example 10 l/min, 15 l/min, 20 l/min or higher. The quench spray 3 includes a large number of jets, in an embodiment, creating droplets of water (or other suitable liquid) flowing at a high speed to dislodge any residual solid particles that may be stuck to a wall of the pipes of the apparatus.

The quench spray 3 drains into a drain tank 4 having a turbulent water flow to ensure that there is no sedimentation. Any gaseous matter such as, for example, undissolved hydrogen and/or unsolidified and undissolved stannane, left in the drain tank 4 is directed upwards into a counter-current tower 5 for acid removal.

The counter-current tower 5 receives gases from the drain tank 4. In a counter-current manner, cyclone mist remover 6 introduces high velocity air into the counter-current tower 5. In the counter-current tower 5, the air from the cyclone mist remover 6 and the gases from drain tank 4 are mixed and reacted with an acid to dissolve any particulate matter leftover in the gases from the drain tank 4. Upon contacting with the acid, the particulate matter dissolves and is dropped back down into the drain tank 4, where it is diluted in water and removed using the turbulent water flow.

Figure 3B:
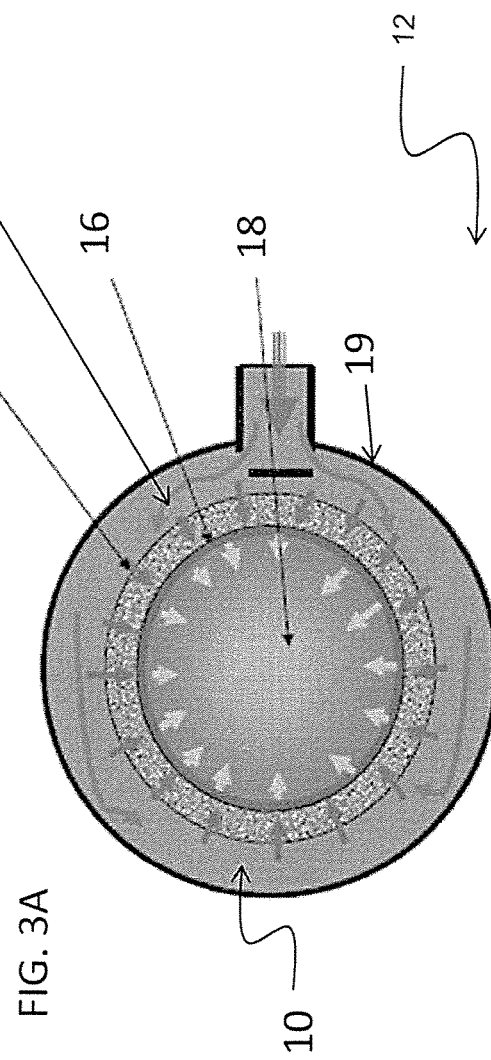

FIGS. 3A and 3B illustrate an exemplary combustor and its functioning in accordance with an embodiment. The combustor 1, in some embodiments, includes a combustor chamber 12, an exhaust gas inlet 15 from where exhaust gases from the extreme ultraviolet chamber are introduced into the combustor 1, an air inlet 11 from where an air/fuel mixture is introduced into the combustor 1, an outlet 17 from where combustion products are removed or exhausted from the combustor 1, and a porous ceramic matrix 10. In various embodiments, the fuel is natural gas (i.e., methane), butane, propane, or any other suitable combustible gas. In some embodiments, air and fuel mixture 13, after entering combustor chamber 12 from air inlet 11, goes around porous ceramic matrix 10 and enters porous ceramic matrix 10.

While not explicitly shown in FIG. 3A, in an embodiment, the combustor chamber 12 has a double-walled structure with, for example, a ceramic inner wall 14 and a stainless steel outer wall 19. In some embodiments, the outer wall 19 is maintained at a relatively low temperature such as, for example, below 40° C. In an embodiment, the outer wall 19 temperature is maintained using an active cooling mechanism such as, for example, water cooling by providing heat-exchanging tubes with flowing cold water along the surface of the outer wall.

In an embodiment, the air inlet 11 directs a volume of air and a fuel into the combustor chamber 12. The volume of air and the fuel to be allowed into the combustor chamber 12 is determined based on the amount of hydrogen flowing into the combustor chamber through the exhaust gas inlet 15. Thus, in an embodiment, the air inlet 11 includes one or more mass flow controllers for controlling the flow rate of air and the fuel entering the combustor chamber 12. The mass flow controllers, in some embodiments, also control the ratio of a volume of air to a volume of the fuel entering the combustor chamber 12 to ensure complete oxidation of the exhaust gases entering the combustor chamber 12 from the exhaust gas inlet 15. Thus, if the amount of exhaust gases entering the combustor chamber 12 from the exhaust gas inlet 15 increases, e.g., when the extreme ultraviolet source is operating at a high power, the amount and flow rate of air and the fuel entering the combustor chamber 12 is increased.

In some embodiments, the exhaust gas inlet 15 is designed to prevent flashback ignition of exhaust gases in the extreme ultraviolet chamber, e.g., if a flame generated in the combustor chamber 12 travels through the exhaust gas inlet 15 because the flow rate of exhaust gases flowing through the exhaust gas inlet 15 is too low. Such flashback ignition can result in serious damage to the equipment in the extreme ultraviolet chamber, causing substantial economic losses. Therefore, great care needs to be taken to avoid such flashback ignition. One way to accomplish this is to ensure a certain minimum flow rate of exhaust gases entering the combustor chamber 12 through the exhaust gas inlet 15. Other ways to accomplish this include, for example, flameless combustion of the exhaust gases in the combustor chamber 12, maintaining the pressure in the combustor chamber 12 below a certain threshold, ensuring complete oxidation of exhaust gases, or any combination thereof.

In an embodiment, the porous matrix 10 is disposed in the combustor chamber 12 such that an air gap is left between the porous matrix 10 and the inner wall of the combustor chamber 12. This air gap enables unobstructed flow of various gases (i.e., exhaust gases from the extreme ultraviolet chamber, air, fuel, and products of combustion) within the combustor chamber 12 and around the porous matrix 10.

As shown in FIG. 3B, the porous ceramic matrix 10 is designed to namelessly ignite the exhaust gases from the extreme ultraviolet chamber received from the exhaust gas inlet 15 which predominantly include hydrogen. A confined radiant combustion zone 18 may be formed inside the porous ceramic matrix 10 that is maintained at an elevated temperature such as, for example, 700-800° C. The elevated temperature of the porous ceramic matrix 10 causes the various gases, i.e., the exhaust gases, air and fuel, react with each other as they pass through the pores of the porous ceramic matrix 10. Without wishing to be bound by theory, the confined space within the pores results in a flameless combustion of the exhaust gases by preventing the products of combustion from expanding to form the flame. Moreover, because the reaction between the exhaust gases (e.g., hydrogen), air and fuel is an exothermic reaction, an additional heating mechanism is not required to maintain the temperature of the porous ceramic matrix 10 in some embodiments. In some embodiments, the air and fuel mixture is ignited inside a region of the porous ceramic matrix 10 having boundary 16 that includes combustion zone 18.

The hydrogen in the exhaust gases combines with oxygen in the air to produce water vapor in the combustion zone. As described elsewhere herein, the water vapor and other combustion products (such as tin oxide, carbon dioxide, etc.) are directed into the cooler 2.

For efficient removal and destruction of hydrogen from the exhaust gases, near complete burning of the hydrogen is desirable. In other words, it is desirable from a safety perspective to avoid any uncombusted hydrogen entering the cooler 2. To achieve this, the volume of air/fuel mixture entering the combustor 1 through the air/fuel inlet 11 needs be adjusted according to the flow rate of exhaust gases leaving the extreme ultraviolet chamber. The rate of flow of exhaust gases from the extreme ultraviolet chamber is in a range from about 10 slm to about 400 slm in some embodiments. However, when the extreme ultraviolet chamber is operated at high power, the rate of flow of hydrogen can exceed 400 slm. In such instances, the volume of air/fuel mixture entering the combustor 1 can be large, thereby increasing the pressure in the combustor 1. As an intrinsic safety mechanism, the extreme ultraviolet tool shuts off the flow of hydrogen (and, thereby shutting off the tool itself) if it is determined that the hydrogen exiting the extreme ultraviolet chamber cannot be efficiently removed and disposed, which may occur if the pressure inside the combustor 1 increases beyond a certain threshold.

Thus, it is desirable to ensure that the pressure inside the combustor 1 held below a certain threshold. For example, in some embodiments, it is desirable for the pressure to be kept in a certain range such as, for example, in a range from about 0.2 kPa to about 1.2 kPa so as to ensure effective and complete burning of hydrogen without triggering the safety mechanism in the extreme ultraviolet tool.

Figure 4A:
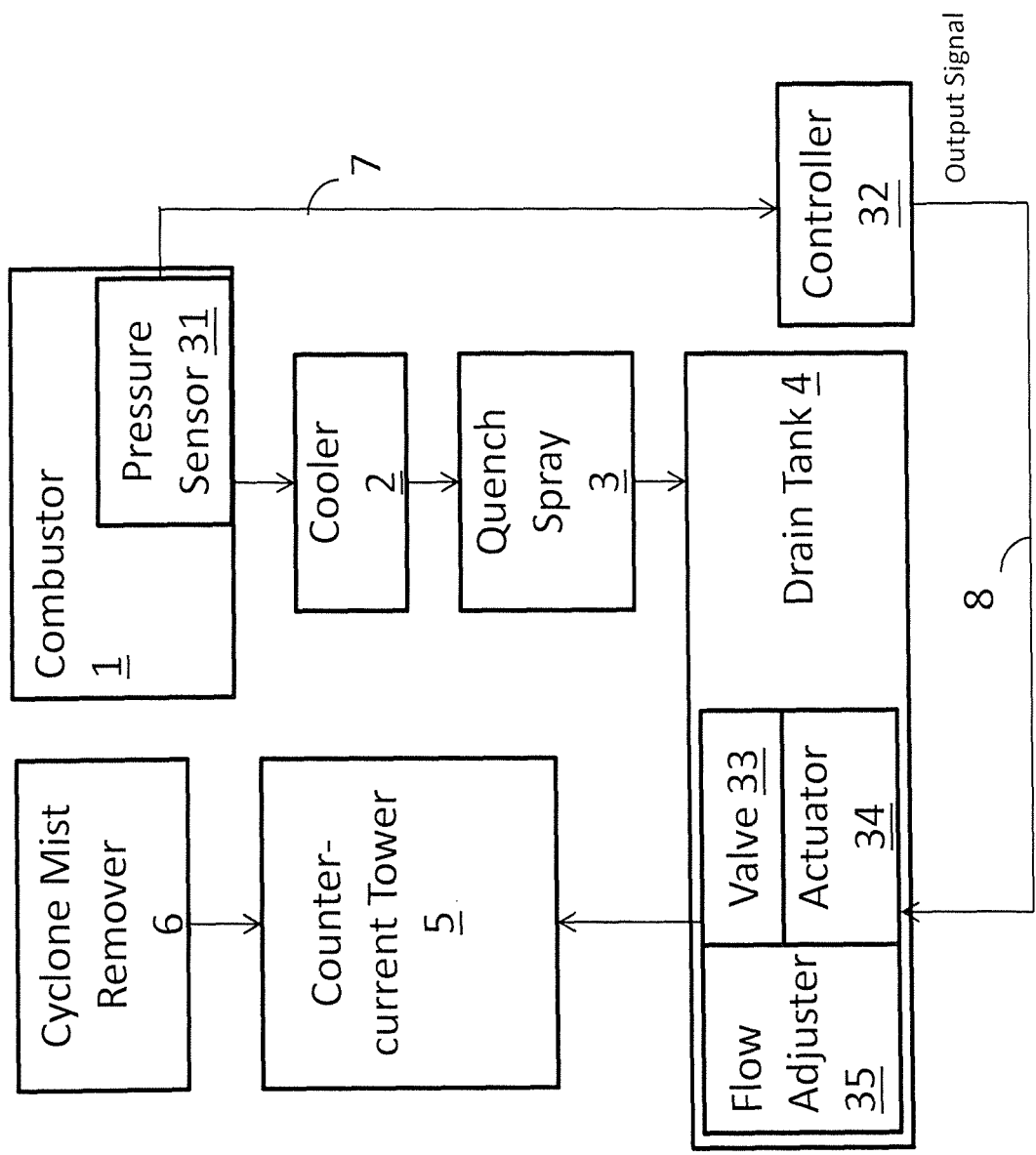
FIG. 4A schematically illustrates a mechanism for maintaining a pressure inside the combustor 1 to prevent unburned hydrogen from exiting the combustor 1 in accordance with an embodiment.

FIG. 4A schematically illustrates a mechanism for maintaining a pressure inside the combustor 1 to prevent unburned hydrogen from exiting the combustor 1 in accordance with an embodiment. In an embodiment, the mechanism is flow adjuster 35 that includes a variable opening control valve that is coupled at the exit of the drain tank 4 for controlling the flow rate of gases out of the combustor 1. In some embodiments, the flow adjuster 35 includes an actuator for opening, closing, and adjusting the control valve. The flow adjuster 35 is described with respect to FIGS. 5A-5E. The flow adjuster 35 is controlled by a controller 32 which receives a signal, e.g., a voltage or current, from the pressure sensor 31 that is proportional to the pressure in the combustor 1. For example, in an embodiment, the controller 32 receives a signal 7 from the pressure sensor 31 and based on the received signal 7, determines that the pressure in the combustor 1 is approaching an upper threshold limit, e.g., 1.2 kPa. Then controller 32 may send an output signal 8 to the actuator 34 of adjuster 35 to adjust the variable opening control valve 33 to increase the volume of gas flowing out of drain tank 4 to the counter-current tower 5 through the control valve 33 by, for example, increasing an opening size of the control valve 33. In some embodiments, the output signal 8 from controller 32 determines whether an amount, the volume of gas flowing out of drain tank 4, should be increased or decreased.

Figure 4B:
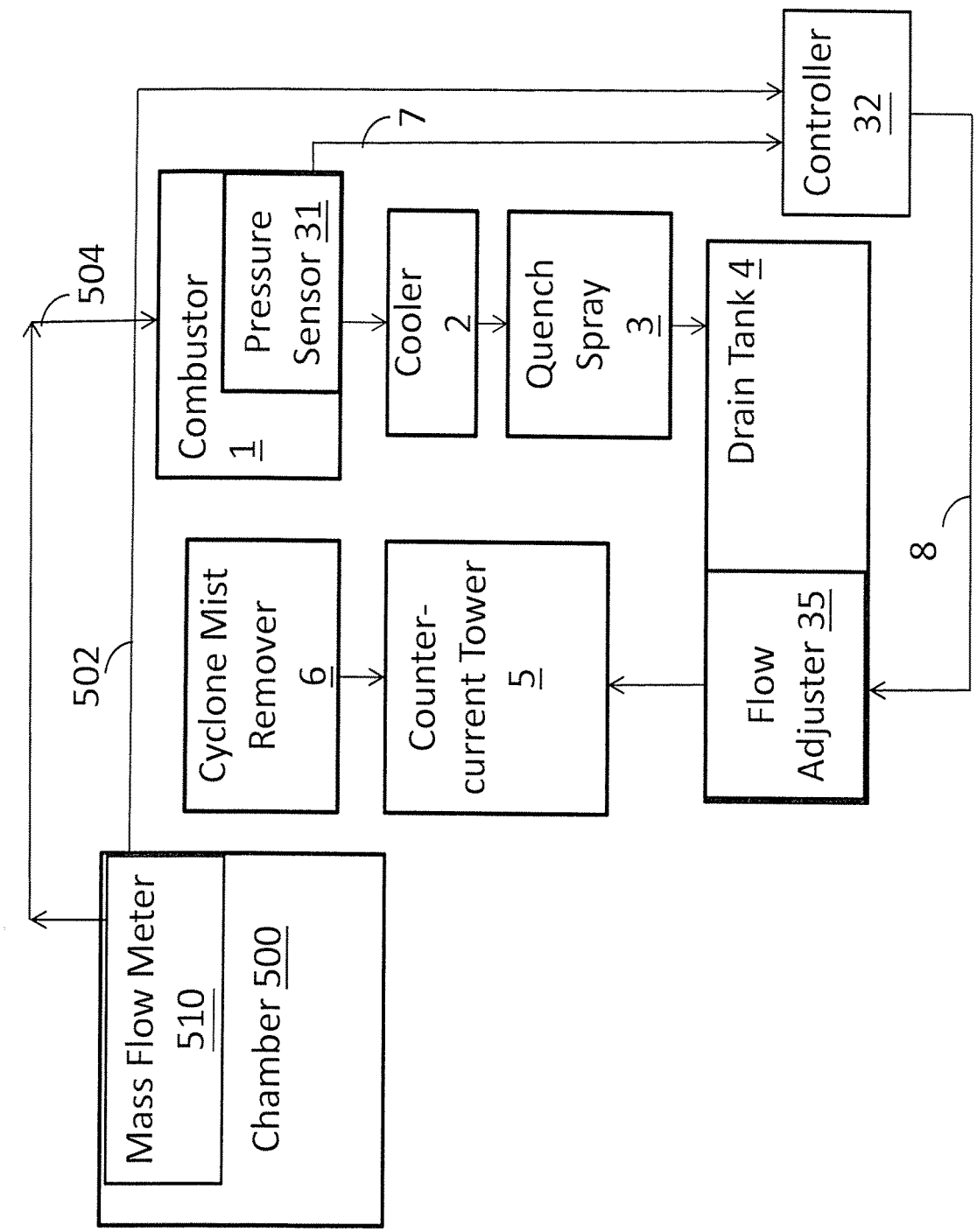
FIG. 4B schematically illustrates a mechanism for maintaining a pressure inside the combustor 1 to prevent unburned hydrogen from exiting the combustor 1 in accordance with an alternative embodiment.

FIG. 4B schematically illustrates a mechanism for maintaining a pressure inside the combustor 1 to prevent unburned hydrogen from exiting the combustor 1 in accordance with an alternative embodiment. In the embodiment depicted in FIG. 4B, the controller 32 receives an additional input signal 502 from the extreme ultraviolet chamber 500. The additional input signal 502 may indicate a flow rate of gases 504 that exit the extreme ultraviolet chamber 500 to enter combustor 1. The flow rate of the exhaust gases, e.g., hydrogen, is measured using a mass flow meter 510 in an embodiment. In such an embodiment, the controller 32 receives signal 502 from the mass flow meter 510 and signal 7 from the pressure sensor 31 to generate output signal 8 that determines whether to increase or decrease the flow rate of gases flowing across the control valve 33 of flow adjuster 35. Upon determining that the flow rate of gases flowing across the control valve 33 of flow adjuster 35 should be changed, the controller 32 sends signal 8 to the actuator 34 of adjuster 35 to change the size of the opening of the control valve 33 to change the flow rate in accordance with the determination by the controller 32.

FIG. 5A illustrate an embodiment of an exemplary flow adjuster, according to some embodiments. Flow adjuster 35 includes control valve 33 and actuator 34. In some embodiments, the flow rate of gases flowing across the flow adjuster 35 is determined by amount of the opening of the variable opening of control valve 33 of the flow adjuster 35. In some embodiments, upon determining that the flow rate of gases flowing across the flow adjuster 35 should be changed, the controller 32 sends a signal, e.g., signal 8 of FIG. 4B, to the actuator 34 of flow adjuster 35 to change the size of the opening of the control valve 33 of flow adjuster 35. In accordance with the determination by the controller 32, the flow rate may increase if the size of the opening of the control valve 33 is increased and the flow rate may decrease if the size of the opening of the control valve 33 is decreased. In some embodiments, controller 32 commands, e.g., send signal 8 to, actuator 34 to increase or decrease the size of the opening of the control valve 33.

Figure 5C:
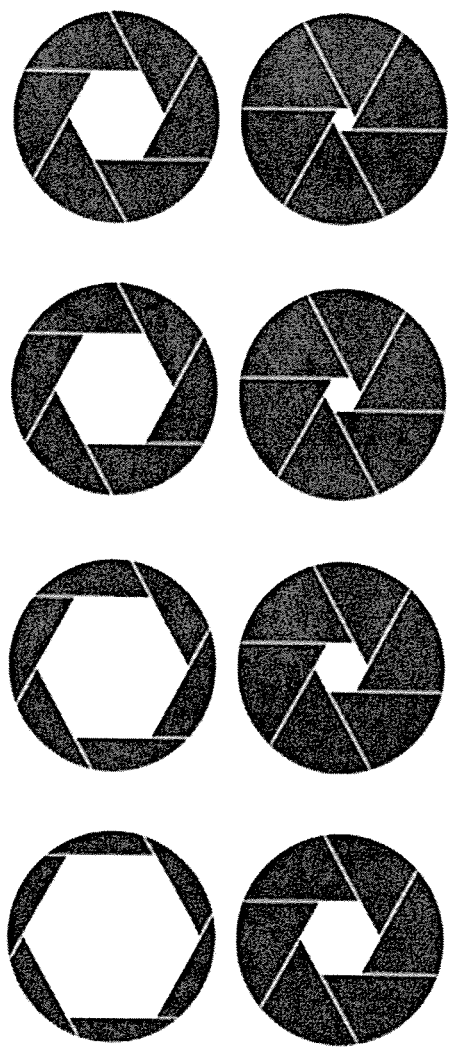

Various embodiments of the control valve are illustrated in FIGS. 5B, 5C, 5D, and 5E. For example, FIG. 5B illustrates the structure of a twin mesh variable opening pressure control valve. The twin mesh valve 33 includes two discs 33A and 33B having a plurality of slits. The area of overlap between the slits controls the flow rate of gases flowing across such a twin mesh valve. For the twin mesh valve, the actuator 34 includes a stepper motor which can turn one or both discs at discrete angles to change the area of overlap between the slits of the two discs 33A and 33B and to change/adjust the opening of the twin mesh valve 33 to adjust the flow rate of flow adjuster 35.

Figure 5D:
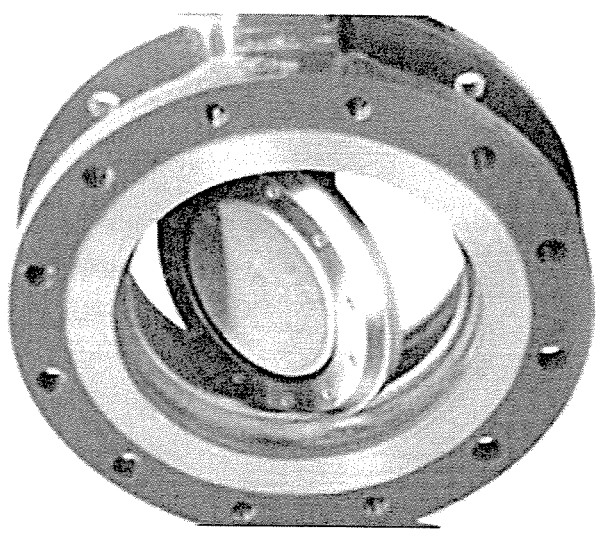
Figure 5E:
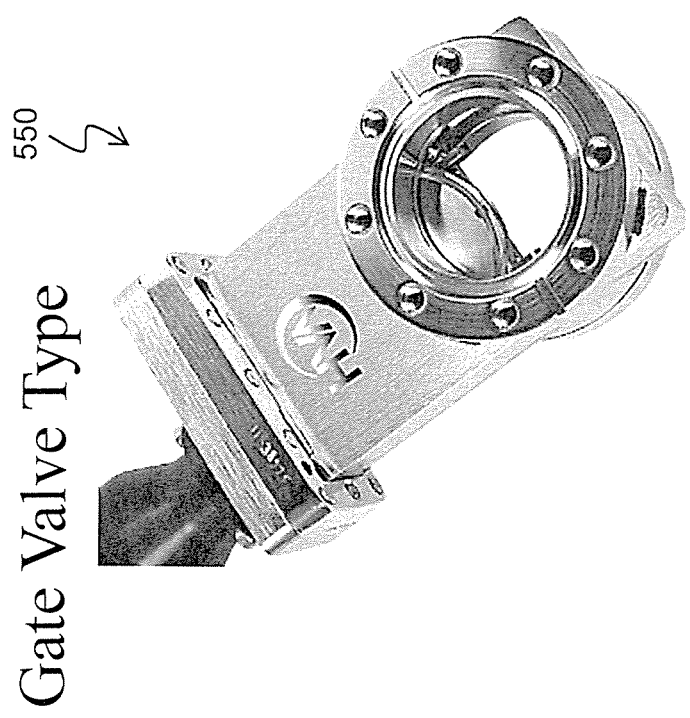

FIG. 5C illustrates variable aperture valves 505. The flow rate of gases flowing across such an aperture valve is controlled by changing the size of the aperture using actuator 34. FIG. 5D illustrates a butterfly valve 520 where an angle of a baffle closing an opening is changed by actuator 34 to control the flow rate of gases flowing across the opening. FIG. 5E illustrates an in-line gate valve 550 where a baffle is moved laterally across the opening by actuator 34 to change the size of the opening, thereby changing the flow rate of the gases flowing across the opening.

In some embodiments, the controller reduces the volume of gas flowing through the control valve to increase the pressure inside the combustor 1 so as to maintain an optimum combustion rate and ensure complete oxidization of the exhausts gases. In other embodiments, the controller increases the volume of gases flowing through the control valve to decrease the pressure inside the combustor 1 to allow for removal and destruction of larger volume of hydrogen.

Figure 6:
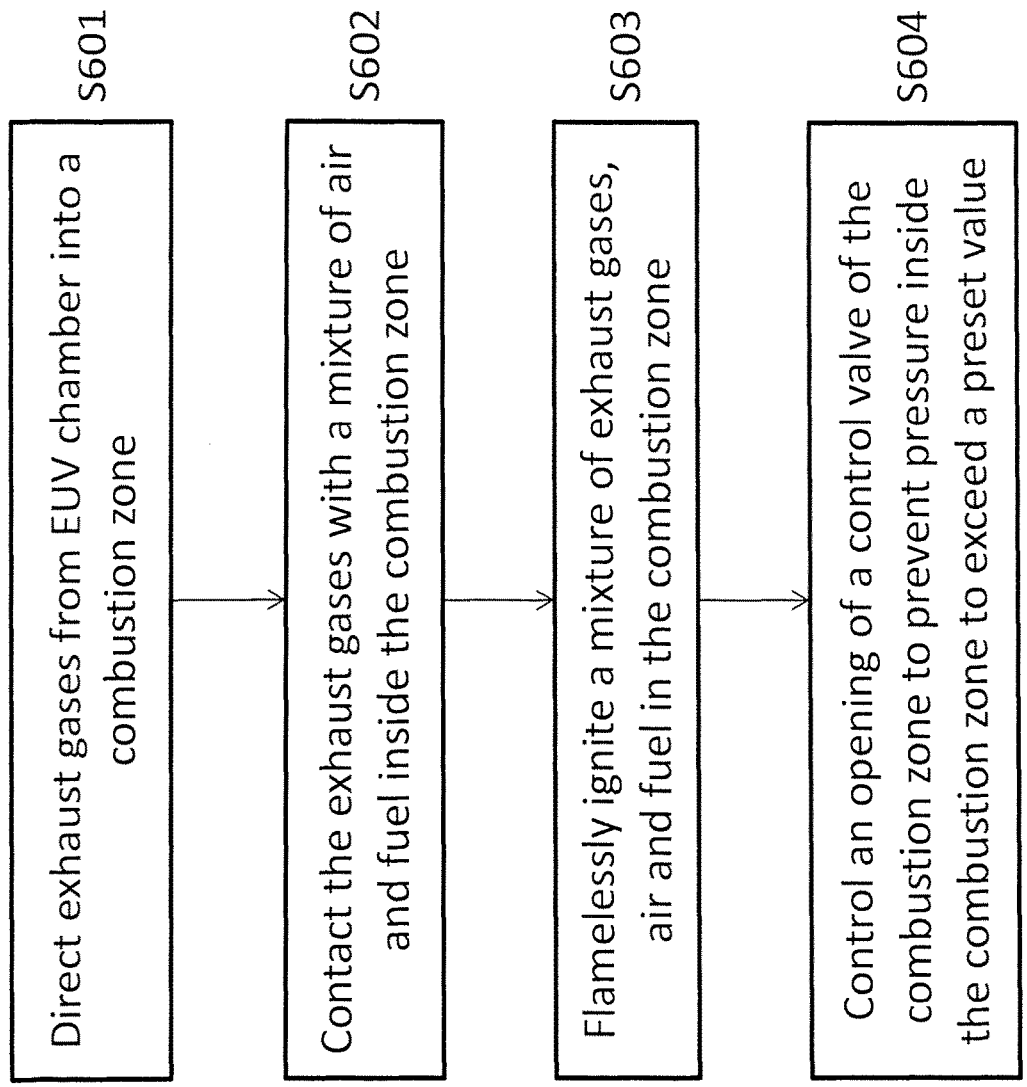
FIG. 6 shows a flow chart of a method of removing exhaust gases from a chamber for processing extreme ultraviolet radiation according to an embodiment of the present disclosure.

FIG. 6 shows a flow chart of a method of removing exhaust gases from a chamber for processing extreme ultraviolet radiation according to an embodiment of the present disclosure. The method includes, at S601, directing the exhaust gases from the chamber into a combustion zone 18 of combustor 1. In some examples, combustor 1 is the combustion zone.

At S602, the exhaust gases are then contacted with a mixture of air and a fuel inside the combustion zone. In an embodiment, a volume and a flow rate of the mixture of air and fuel contacting the exhaust gases is controlled such that the exhaust gases are completely oxidized within the combustion zone.

At S603, a mixture of the exhaust gases, air and the fuel is namelessly ignited in the combustion zone.

At S604, an opening of a control valve, e.g., control valve 33, of a flow adjuster, e.g., flow adjuster 35, may be coupled to the combustion zone to control a pressure inside the combustion zone and to prevent a pressure inside the combustion zone from exceeding a preset pressure value. The control valve is configured to change a volume of fluid exhausted from the combustion zone. In some embodiments, flow adjuster 35 is included in drain tank 4 and is coupled to pressure sensor 31 via controller 32 to control the flow rate going out of drain tank 4. By controlling the flow rate going out of drain tank 4, the pressure inside the combustion zone of combustor 1 that is coupled via quench spray 3 and cooler 2 to the combustor 1, may indirectly be controlled. In some embodiments, controller 32 and flow adjuster 35 are included in combustor 1 to directly control the pressure inside the combustion zone of combustor 1 by adjusting a flow rate going out of combustor 1. In an embodiment, the preset pressure value is equal to or less than 1.2 kPa. In an embodiment, the opening of the control valve is controlled based on an output of a pressure sensor provided outside the combustion zone. The control valve, in various embodiments, includes a twin mesh variable opening valve, a butterfly valve, an aperture valve, an inline gate valve, or any other suitable variable opening valve. The opening of the control valve is changed such that a volume and a flow rate of gases flowing across the control valve are changed to maintain the pressure in the combustion zone.

The embodiments disclosed herein provide improved controlled for hydrogen flow in the chamber of an extreme ultraviolet source, thereby providing a more stable hydrogen pressure in the chamber. In particular when the extreme ultraviolet source is operated at a high power, the flow rate of hydrogen through the chamber is increased substantially. If this increased hydrogen flow is not regulated properly, the hydrogen pressure inside the chamber can increase, resulting in a shut-down of the source to maintain safe operating conditions. By improving the control of flow rate of hydrogen, such source shut-downs are prevented, thereby increasing the yield of the extreme ultraviolet lithography tool as well as saving the expense associated with restarting the extreme ultraviolet lithography tool.

In one aspect of the present disclosure, an apparatus for processing exhaust gases from a chamber for processing extreme ultraviolet radiation includes a gas inlet configured to direct the exhaust gases from the chamber into a combustion zone. The combustion zone is configured to flamelessly ignite the exhaust gases. An air inlet is configured to direct a mixture of air and a fuel into the combustion zone. A control valve is configured to change a volume of fluid exhausted from the combustion zone. A controller is configured to control the control valve so as to prevent a pressure inside the combustion zone from exceeding a preset pressure value. In an embodiment, the combustion zone includes a porous ceramic matrix. In an embodiment, the control valve is selected from the group consisting of a twin mesh variable opening valve, a butterfly valve, an aperture type valve, an in-line gate valve, and a combination thereof. In an embodiment, the controller is configured to control an opening of the control valve based on an output of a pressure sensor provided outside the combustion zone. In an embodiment, the controller is configured to control an opening of the control valve using an actuator coupled to the control valve, the actuator being configured to control an opening of the control valve and change a volume of gas passing through the control valve. In an embodiment, the combustion zone has a temperature in a range from 700° C. to 800° C. In an embodiment, the fuel includes methane. In an embodiment, the preset pressure value is equal to or less than 1.2 kPa. In an embodiment, the exhaust gases include hydrogen. In an embodiment, the air inlet includes an air flow controller configured to change a volume of the air and the fuel entering the combustor based on a volume of exhaust gas entering the combustion zone. In an embodiment, the air flow controller is configured to maintain a volume of the air and the fuel in the combustion zone so as to completely oxidize the exhaust gases from the chamber within the combustion zone. In an embodiment, the gas inlet is configured to maintain a flow velocity of the exhaust gases so as to prevent flashback ignition of the exhaust gases in the chamber. In an embodiment, the chamber for processing extreme ultraviolet radiation is a portion of an extreme ultraviolet source. In an embodiment, the chamber for processing extreme ultraviolet radiation is a part of an extreme ultraviolet scanner.

In another aspect of the present disclosure, a method of removing exhaust gases from a chamber for processing extreme ultraviolet radiation include directing the exhaust gases from the chamber into a combustion zone. The exhaust gases inside the combustion zone are contacted with a mixture of air and a fuel. A mixture of the exhaust gases, air and the fuel is flamelessly ignited in the combustion zone. An opening of a control valve of the combustion zone is controlled to prevent a pressure inside the combustion zone from exceeding a preset pressure value, the control valve being configured to change a volume of fluid exhausted from the combustion zone. In an embodiment, the preset pressure value is equal to or less than 1.2 kPa. In an embodiment, controlling an opening of the control valve includes changing a size of the opening based on an output of a pressure sensor provided outside the combustion zone. In an embodiment, the method further includes controlling a volume and a flow rate of the mixture of air and fuel contacting the exhaust gases such that the exhaust gases are completely oxidized in the combustion zone.

In yet another aspect of the present disclosure, an apparatus for generation of extreme ultraviolet radiation includes an extreme ultraviolet generation chamber including a hydrogen inlet and a hydrogen outlet. A combustor is configured to oxidize an entirety of hydrogen output by the extreme ultraviolet generation chamber. A flow controller is coupled to the combustor. The flow controller is configured to prevent a pressure inside the combustor from exceeding a preset pressure value, and the flow controller comprising a control valve configured to change a volume of gas exhausted from the combustor. In an embodiment, the control valve has a variable opening controlling a volume and a flow rate of gases passing through the control valve. The variable opening is controlled based on an output of a pressure sensor provided outside the combustor.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for processing exhaust gases from a chamber for processing extreme ultraviolet radiation, the apparatus comprising:
    a gas inlet configured to direct the exhaust gases from the chamber into a combustion zone, the combustion zone being configured to flamelessly ignite the exhaust gases;
    an air inlet configured to direct a mixture of air and a fuel into the combustion zone;
    a control valve configured to change a volume of fluid exhausted from the combustion zone; and
    a controller configured to control the control valve so as to prevent a pressure inside the combustion zone from exceeding a preset pressure value.

2. The apparatus of claim 1, wherein the combustion zone comprises a porous ceramic matrix.

3. The apparatus of claim 1, wherein the control valve is selected from the group consisting of a twin mesh variable opening valve, a butterfly valve, an aperture type valve, an in-line gate valve, and a combination thereof.

4. The apparatus of claim 1, wherein the controller is configured to control an opening of the control valve based on an output of a pressure sensor provided outside the combustion zone.

5. The apparatus of claim 1, wherein the controller is configured to control an opening of the control valve using an actuator coupled to the control valve, the actuator being configured to control an opening of the control valve and change a volume of gas passing through the control valve.

6. The apparatus of claim 1, wherein the combustion zone is configured to operate at a temperature in a range from 700° C. to 800° C.

7. The apparatus of claim 1, wherein the fuel comprises methane.

8. The apparatus of claim 1, wherein the preset pressure value is equal to or less than 1.2 kPa.

9. The apparatus of claim 1, wherein the exhaust gases comprise hydrogen.

10. The apparatus of claim 1, wherein the air inlet comprises an air flow controller configured to change a volume of the air and the fuel entering the combustion zone based on a volume of exhaust gas entering the combustion zone.

11. The apparatus of claim 10, wherein the air flow controller is configured to maintain a volume of the air and the fuel in the combustion zone so as to completely oxidize the exhaust gases from the chamber within the combustion zone.

12. The apparatus of claim 1, wherein the gas inlet is configured to maintain a flow velocity of the exhaust gases so as to prevent flashback ignition of the exhaust gases in the chamber.

13. The apparatus of claim 1, wherein the chamber for processing extreme ultraviolet radiation is a portion of an extreme ultraviolet source.

14. The apparatus of claim 1, wherein the chamber for processing extreme ultraviolet radiation is a part of an extreme ultraviolet scanner.

15. A method of removing exhaust gases from a chamber for processing extreme ultraviolet radiation, the method comprising:
    directing the exhaust gases from the chamber into a combustion zone;
    contacting the exhaust gases inside the combustion zone with a mixture of air and a fuel;

flamelessly igniting a mixture of the exhaust gases, air and the fuel in the combustion zone; and controlling an opening of a control valve of the combustion zone to prevent a pressure inside the combustion zone from exceeding a preset pressure value, the control valve being configured to change a volume of fluid exhausted from the combustion zone.

16. The method of claim 15, wherein the preset pressure value is equal to or less than 1.2 kPa.

17. The method of claim 15, wherein controlling an opening of the control valve comprises changing a size of the opening based on an output of a pressure sensor provided outside the combustion zone.

18. The method of claim 15, further comprising controlling a volume and a flow rate of the mixture of air and fuel contacting the exhaust gases such that the exhaust gases are completely oxidized in the combustion zone.

19. An apparatus for generation of extreme ultraviolet radiation, the apparatus comprising:

an extreme ultraviolet generation chamber comprising a hydrogen inlet and a hydrogen outlet;

a combustor configured to oxidize an entirety of hydrogen output by the extreme ultraviolet generation chamber; and a flow controller coupled to the combustor, the flow controller being configured to prevent a pressure inside the combustor from exceeding a preset pressure value, and the flow controller comprising a control valve configured to change a volume of gas exhausted from the combustor.

20. The apparatus of claim 19, wherein the control valve has a variable opening controlling a volume and a flow rate of gases passing through the control valve, the variable opening being controlled based on an output of a pressure sensor provided outside the combustor.

* * * * *